US010305451B1

(12) United States Patent
Rangachari et al.

(10) Patent No.: US 10,305,451 B1
(45) Date of Patent: May 28, 2019

(54) MULTIPLIER-BASED PROGRAMMABLE FILTERS

(71) Applicant: TEXAS INSTRUMENTS INCORPORATED, Dallas, TX (US)

(72) Inventors: Sundarrajan Rangachari, Tamilnadu (IN); Jaiganesh Balakrishnan, Bangalore (IN); Jawaharlal Tangudu, Bangalore (IN); Srinivas Kumar Reddy Naru, Markapur (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/839,265

(22) Filed: Dec. 12, 2017

(51) Int. Cl.
*H03H 17/02* (2006.01)
*H03H 17/06* (2006.01)

(52) U.S. Cl.
CPC .... *H03H 17/0294* (2013.01); *H03H 17/0225* (2013.01); *H03H 2017/0295* (2013.01); *H03H 2017/0297* (2013.01); *H03H 2017/0692* (2013.01)

(58) Field of Classification Search
USPC .................................................. 708/300–323
See application file for complete search history.

(56) References Cited

U.S. PATENT DOCUMENTS

| 4,602,285 | A | * | 7/1986 | Beaulier | ............... G06T 3/40 345/670 |
| 5,402,369 | A | * | 3/1995 | Main | ............... G06F 7/5334 708/620 |
| 2012/0201338 | A1 | * | 8/2012 | Leung | ............... H03C 3/0941 375/376 |

* cited by examiner

*Primary Examiner* — Tan V Mai
(74) *Attorney, Agent, or Firm* — James R. Pessetto; Charles A. Brill; Frank D. Cimino

(57) ABSTRACT

In some embodiments, a multiplier-based programmable filter comprises a pre-scaling circuit, a first multiplier circuit coupled to a first output of the pre-scaling circuit and a second output of the pre-scaling circuit, and a second multiplier circuit coupled to the first output of the pre-scaling circuit and the second output of the pre-scaling circuit. In some embodiments, the multiplier-based programmable filter also comprises a first adder coupled to a first output of the first multiplier circuit and a second output of the first multiplier circuit, a second adder coupled to a first output of the second multiplier circuit and a second output of the second multiplier circuit, first register coupled to an output of the first adder and an input of the second adder, and a second register coupled to an output of the second adder.

20 Claims, 5 Drawing Sheets

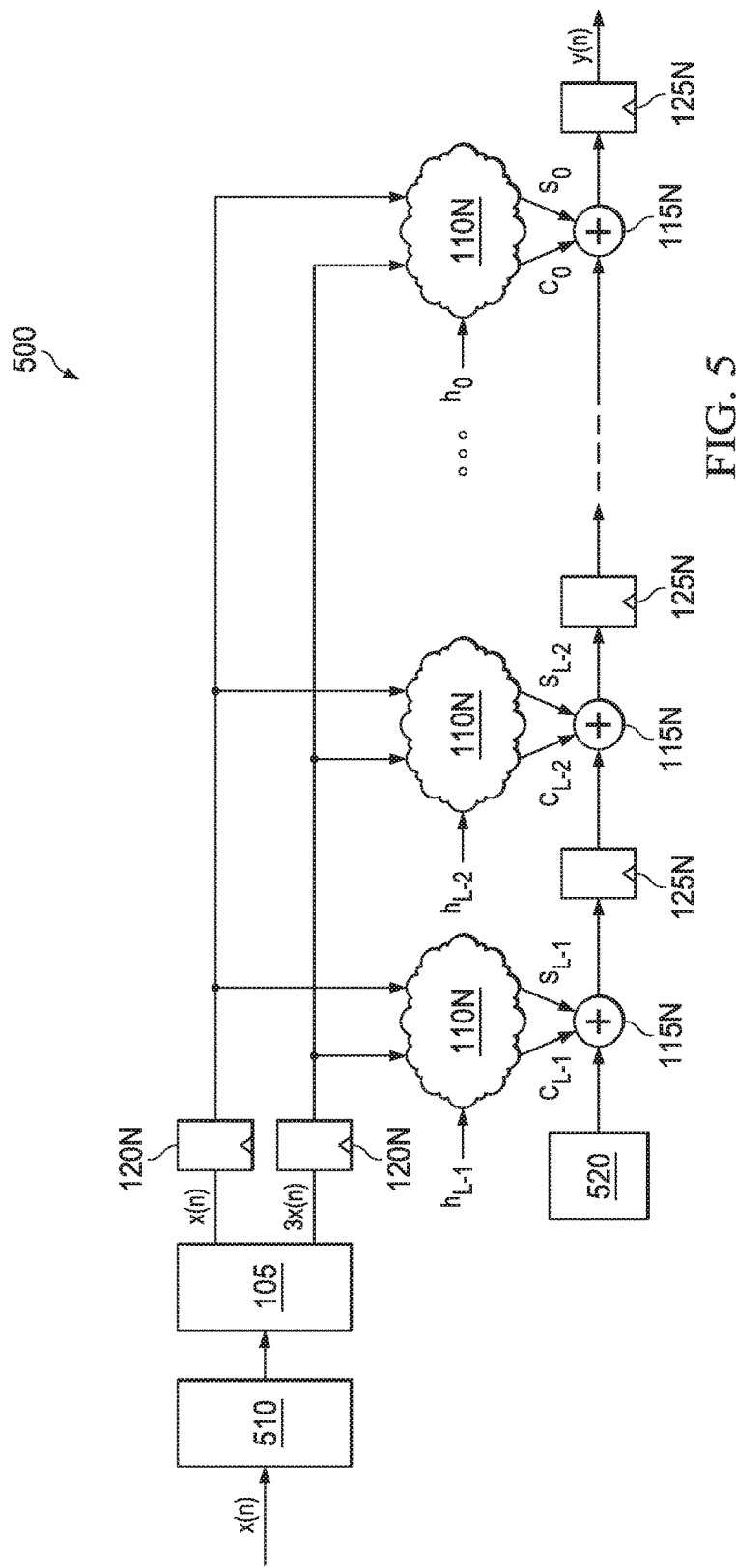

MULTIPLIER-BASED PROGRAMMABLE FILTERS

BACKGROUND

Filters are electronic devices that may be capable of modifying a first input signal based on a desired characteristic or a second input signal. Some filters are pre-configured to modify the first input signal based on the desired characteristic and some filters are programmable such that an end-user may provide the second input signal for modifying the first input signal. Filters may be incorporated as components into a number of electronic devices.

SUMMARY

In some embodiments, a multiplier-based programmable filter comprises a pre-scaling circuit, a first multiplier circuit coupled to a first output of the pre-scaling circuit and a second output of the pre-scaling circuit, and a second multiplier circuit coupled to the first output of the pre-scaling circuit and the second output of the pre-scaling circuit. In some embodiments, the multiplier-based programmable filter also comprises a first adder coupled to a first output of the first multiplier circuit and a second output of the first multiplier circuit, a second adder coupled to a first output of the second multiplier circuit and a second output of the second multiplier circuit, first register coupled to an output of the first adder and an input of the second adder, and a second register coupled to an output of the second adder.

In some embodiments, a filter comprises pre-scaling circuitry configured to receive a multiplier, generate a pre-scaled multiplier based on the multiplier, and output the multiplier and the pre-scaled multiplier. In some embodiments, the filter further comprises a first multiplier circuit coupled to the pre-scaling circuitry and configured to receive the multiplier, the pre-scaled multiplier, and a first multiplicand, calculate a first plurality of intermediate outputs based on the multiplier and the first multiplicand, and calculate a first carry-sum output based on the first plurality of intermediate outputs, the first carry-sum output comprising a first carry output and a first sum output. In some embodiments, the filter further comprises a first adder coupled to the first multiplier circuit and configured to add the first carry output and the first sum output to form a first partial product. In some embodiments, the filter further comprises a second multiplier circuit coupled to the pre-scaling circuitry and configured to receive the multiplier, the pre-scaled multiplier, and a second multiplicand, calculate a second plurality of intermediate outputs based on the multiplier and the second multiplicand, and calculate a second carry-sum output based on the second plurality of intermediate outputs, the second carry-sum output comprising a second carry output and a second sum output. In some embodiments, the filter further comprises a second adder coupled to the second multiplier circuit and the first adder and configured to add the second carry output, the second sum output, and the first partial product.

In some embodiments, a method implemented by a multiplier-based programmable filter comprises receiving a multiplier, generating, by pre-scaling circuitry, at least one pre-scaled multiplier, generating, by a first multiplier, a first carry-sum output based at least partially on the multiplier and a first multiplicand, and adding, by a first adder, a carry output of the first carry-sum output and a sum output of the first carry-sum output to form a first partial product. In some embodiments, the method further comprises generating, by a second multiplier, a second carry-sum output based at least partially on the multiplier and a second multiplicand, adding, by a second adder, a carry output of the second carry-sum output, a sum output of the second carry-sum output, and the first partial product, and adding one or more compensation values to an output of the second adder to generate a filtered output signal. In some embodiments, the method further comprises transmitting the filtered output signal by the multiplier-based programmable filter.

BRIEF DESCRIPTION OF THE DRAWINGS

For a detailed description of various examples, reference will now be made to the accompanying drawings in which:

FIG. 5 shows a schematic diagram of an illustrative multiplier-based programmable filter in accordance with various embodiments;

DETAILED DESCRIPTION

Figure 1:
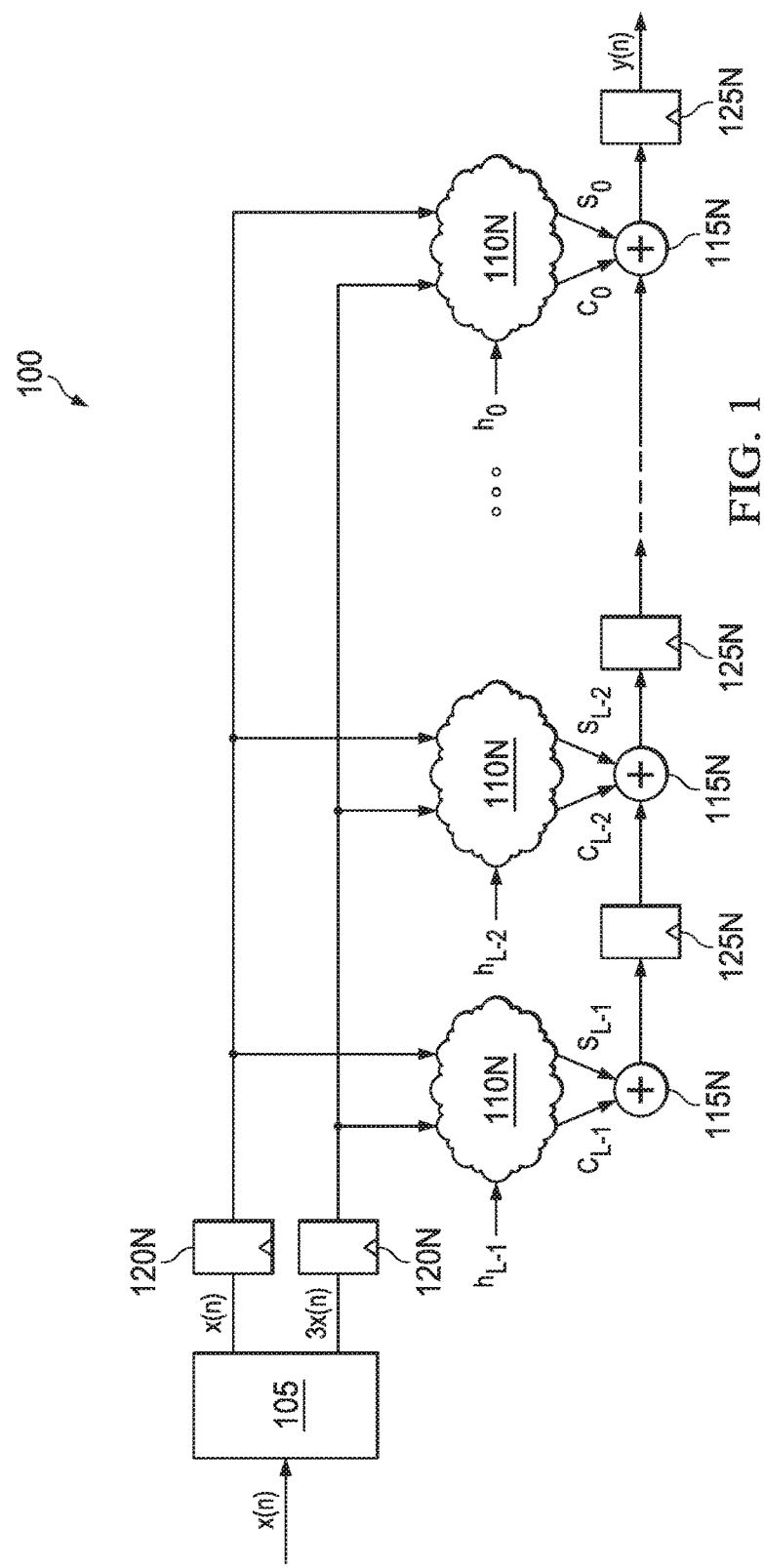
FIG. 1 shows a schematic diagram of an illustrative multiplier-based programmable filter in accordance with various embodiments.

Programmable filters may be implemented in transceivers (or receivers/transmitters) to filter a signal based on programmable characteristics. For example, the filter may be programmable to operate as a low-pass filter, a high-pass filter, a band-pass filter, a band-stop filter, or other filter types based on received filter coefficients. The filter coefficients may be multiplied by an input signal (e.g., the signal to be filtered) to create partial products that are then summed to produce the filtered signal. For example, in a low-pass filter, filter coefficients for components of the input signal may be high (e.g., approximately equal to one) and filter coefficients for high-frequency components of the input signal may be low (e.g., approximately equal to zero) to attenuate the high-frequency components of the input signal after the multiplication. In wide bandwidth implementations, programmable filters may operate at high sampling rates (e.g., up to about 750 million samples per second) which may also result in comparatively high power consumption (e.g., several hundred milliwatts of power). To reduce cost, such as power consumed and space (e.g., silicon area) occupied, new programmable filter implementations may be created.

Disclosed herein are embodiments that provide for a multiplier-based programmable filter. The multiplier-based programmable filter may filter an input signal by multiplying the input signal by one or more filter coefficients, for example, according to a Booth multiplication architecture or any other suitable multiplication architecture. In some embodiments, the Booth multiplication architecture may be a Radix-8 architecture, while in other embodiments (e.g., as determined by desired multiplicand bit width) other Radix value architectures may be used such as Radix-16, Radix-4, or combinations of multiple Radices. For the purposes of this disclosure, the multiplier-based programmable filter is discussed as implementing a Booth Radix-8 structure in a transposed form architecture filter, though the disclosure may be equally applicable or adaptable to other Radices, multiplication architectures, and/or filter forms without departing from the scope of the present disclosure. In a transposed form architecture filter, an input data sample may be multiplied substantially simultaneously with all filter coefficients of the filter and a result of those multiplications may be added with a previously stored intermediate sum of partial products of the multiplication and then stored. In the Booth Radix-8 structure, the multiplicand (e.g., the filter coefficients of the multiplier-based programmable filter) may be split into multiple groups of four bits each with one bit of overlap with another group. For each group, a partial product that is added to form a final multiplication output may be 0, +/−2×, +/−3×, or +/−4×, where X is the multiplier (e.g., the input signal to be filtered).

In some embodiments, the values of 2× and 4× of the multiplier may be calculated by each multiplier circuit of the multiplier-based programmable filter shifting bits of the multiplier left. For example, a shift left by one bit may create the value of 2× of the multiplier and a shift left by a second bit may create the value of 4× of the multiplier. In some embodiments, the value of 3× of the multiplier may be pre-calculated in the multiplier-based programmable filter a single time and propagated to each of the multiplier circuits in the multiplier-based programmable filter as a pre-scaled multiplier. For a multiplier-based programmable filter having L taps, where L is an integer value greater than zero, pre-calculating the pre-scaled multiplier may reduce a number of addition operations in the multiplier-based programmable filter by L−1 addition operations. Thus, pre-calculating and propagating the pre-scaled multiplier to the multiplier circuits of the multiplier-based programmable filter may, for example, reduce an area consumed by the multiplier circuits and result in savings in both power consumed and area consumed by the multiplier-based programmable filter.

In some embodiments, each multiplier circuit of the multiplier-based programmable filter may provide a carry-sum output (e.g., a separate carry output bus and sum output bus) from the multiplier circuit for addition outside of the multiplier circuit. Outputting the carry and sum output buses may, for example, increase the speed of operation of the multiplier-based programmable filter by not providing for addition (e.g., ripple addition) of the carry and sum output buses within each multiplier circuit prior to output and may reduce a size of each multiplier circuit of the multiplier-based programmable filter by not including an additional adder specifically for adding the carry and sum output buses inside the multiplier circuit. In some embodiments, each carry output bus and each sum output bus may be a multi-bit bus.

In some embodiments, each multiplier circuit of the multiplier-based programmable filter may be configured to receive the multiplier, the pre-computed value of 3× of the multiplier, and the multiplicand and determine the carry output bus and the sum output bus based on the received data. Each multiplier circuit may comprise a plurality of shifter, inverter, selector circuits each configured to receive the multiplier, the pre-computed value of 3× of the multiplier, and at least a portion of the multiplicand, as well as a carry save adder coupled to each of the shifter, inverter, selector circuits and configured to determine the carry and sum output buses based at least partially on outputs of at least some of the shifter, inverter, selector circuits. Each of the shifter, inverter, selector circuits may comprise a shifter configured to receive the multiplier and compute the value of 2× of the multiplier and the value of 4× of the multiplier. Each of the shifter, inverter, selector circuits may also comprise a first multiplexer configured to receive a value of zero, the multiplier, the values of 2×, 3×, and 4× of the multiplier, and a scale control signal. Each of the shifter, inverter, selector circuits may further comprise an inverter and a second multiplexer each coupled to the first multiplexer, the inverter configured to determine a one's complement inversion of an output of the first multiplexer and the second multiplexer configured to receive the output of the first multiplexer, the output of the inverter, and a negation control signal.

The scale control signal and the negation control signal may be computed, for example, by an encoding circuit. In an embodiment, the encoding circuit may include an inverter and a multiplexer configured to generate the scale control signal and the negation control signal based on at least a portion of the multiplicand. For example, when the encoding circuit receives 4 bits of the multiplicand, the most significant bit may be output as the negation control signal and provided to the multiplexer as a control signal of the multiplexer. The 3 least significant bits of the multiplicand may be provided to the multiplexer at a first input and in an inverted form (e.g., via the inverter) at a second input, where an output of the multiplexer determined based at least partially on the control signal (e.g., the most significant bit received by the encoding circuit) is the scale control signal.

In an embodiment, the multiplier-based programmable filter may convert the multiplier to a binary offset format before processing the multiplier. Converting the multiplier to the binary offset format may, in some embodiments, introduce a bias into the multiplier. The multiplier-based programmable filter may compensate for the bias by pre-computing the bias value and subtracting the bias value from a final output of the multiplier-based programmable filter.

In an embodiment, the multiplier circuits of the multiplier-based programmable filter may include quantization circuitry. The quantization circuitry may be configured to, for example, truncate a portion of least significant bits of the multiplier and the value of 3× of the multiplier prior to computation by each multiplier of the multiplier-based programmable filter.

Referring now to FIG. 1, a schematic diagram of an illustrative multiplier-based programmable filter 100 in accordance with various embodiments is shown. Although not shown, the multiplier-based programmable filter 100 may be implemented, for example, in a signal transceiver such as a base station transceiver, a signal chain transceiver, or any other suitable form of signal or data processing device. The multiplier-based programmable filter 100 may scale an input signal (the multiplier, illustrated as x(n)) based on programmable filter coefficients (the multiplicand, illustrated as h) to filter the input signal according to the coefficients.

In an embodiment, the multiplier-based programmable filter 100 includes pre-scaling circuitry 105 (alternatively referred to as a pre-scaling circuit), a plurality of multiplier circuits 110N, a plurality of adders 115N, a plurality of registers 120N, and a plurality of registers 125N. In an embodiment, the pre-scaling circuitry 105 includes a first output coupled to a data input of a first register 120N and a second output coupled to a data input of a second register 120N. The first register 120N and the second register 120N may each be coupled at an output to inputs of each of the multiplier circuits 110N. In some embodiments, the first register 120N and the second register 120N may be omitted such that the first and second outputs of the pre-scaling circuitry 105 are coupled to inputs of each of the multiplier circuits 110N. Each of the multiplier circuits 110N may be coupled at a carry output and a sum output to inputs of one of the adders 115N. Each of the adders 115N may be coupled at an output to an input of a register 125N successively such that an output of each adder 115N is coupled to an input of a register 125N and at least some of the registers 125N include outputs coupled to an input of an adder 115N.

The pre-scaling circuitry 105 may be configured to receive the multiplier for processing by the multiplier-based programmable filter 100. The multiplier may be received, for example, from an antenna, a receiver, a previous processing stage, or any other element of a device in which the multiplier-based programmable filter 100 is implemented. In addition, the multiplier may be received from another component of the multiplier-based programmable filter 100 that previously received the multiplier from another element of the device in which the multiplier-based programmable filter 100 is implemented, for example, as will be discussed in greater detail below. The pre-scaling circuitry 105 may be configured to, for example, output the multiplier as well as generate and output one or more additional signals that may be multiples (e.g., a scaled version of) of the multiplier (e.g., the pre-scaled multiplier, illustrated as 3x(n)). For example, in at least some embodiments the pre-scaling circuitry 105 may generate and output a pre-scaled multiplier that is three times the multiplier. In other embodiments, the pre-scaling circuitry 105 may generate and output additional signals, such as signals that may be five times the multiplier, six times the multiplier, seven times the multiplier, etc. The pre-scaling circuitry 105 may generate the signals according to any suitable method, a scope of which is not limited herein. In one embodiment, the pre-scaling circuitry 105 may be configured to generate the pre-scaled multiplier that is three times the multiplier by implementing a shifter configured to shift the multiplier left by one bit (e.g., to create a shifted signal that is two times the multiplier) and an adder configured to add the multiplier to the shifted signal to generate the pre-scaled multiplier that is three times the multiplier.

The multiplier and the scaled multiplier may be output by the pre-scaling circuitry 105 and stored in respective registers 120N. Each of the registers 120N and the registers 125N of the present disclosure may be any structure capable of, or suitable for, storing data. For example, the registers 120N may be implemented as digital flip-flops, latches, data registers, or any other suitable data storage structure. Additionally, any one or more of the registers 120N may be of a first structure and any one or more other registers 120N may be of a second structure, third structure, and the like such that each register 120N in the multiplier-based programmable filter 100 may not be of an identical, or substantially same, structure.

Each multiplier circuit 110N may receive the multiplier from a register 120N and the scaled multiplier from another register 120N. Each multiplier circuit 110N may also receive at least a portion of the multiplicand. As discussed above, the multiplicand may be programmable (e.g., user selectable). In some embodiments, the multiplicand received by each multiplier circuit 110N may be substantially the same, while in other embodiments the multiplicand received by at least some of the multiplier circuits 110N may be different than the multiplicand received by other of the multiplier circuits 110N. In an embodiment, each multiplier circuit 110N multiplies the multiplier based at least partially on the multiplicand to produce an output. In at least some embodiments, the multiplier circuits 110N may each provide the output in a carry-sum format (illustrated as C and S, respectively).

In an embodiment, each multiplier circuit 110N may provide its carry-sum output to an adder 115N to which the respective multiplier circuit 110N is coupled. The adders 115N may be configured to add the carry and-sum output of the multiplier circuit 110N (e.g., to form a partial product of the respective multiplier circuit 110N) and provide an output to a register 125N. In some embodiments, at least some of the adders 115N may be further configured to add a result of a previous stage of the multiplier-based programmable filter 100 with the carry-sum output of the multiplier circuit 110N. The result of the previous stage may be received by an adder 115N, for example, from a register 125N in which the previous result was stored after computation by another one of the adders 115N. In some embodiments, a final result of the multiplier-based programmable filter 100 (illustrated as y(n)) may be stored in one of the registers 125N after a final addition operation is performed by one of the adders 115N.

Figure 2:
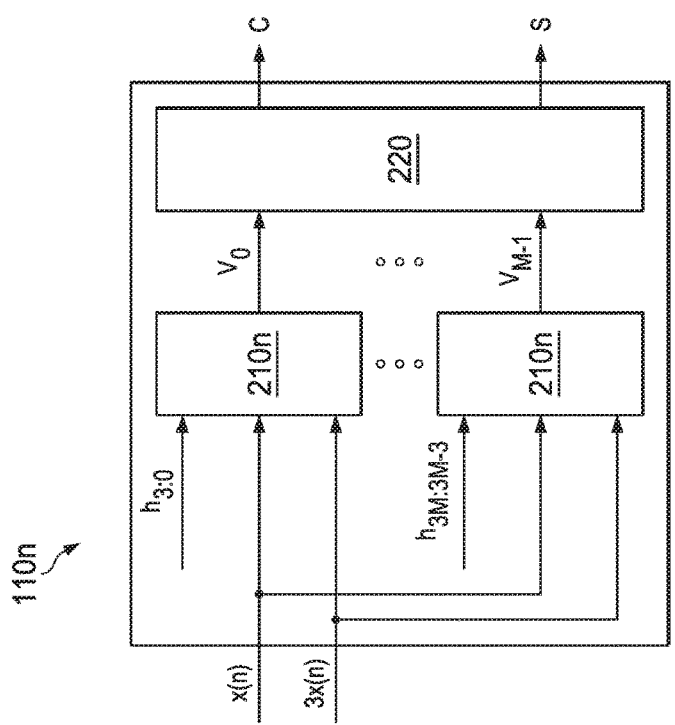
FIG. 2 shows a schematic diagram of an illustrative multiplier circuit in accordance with various embodiments.

Referring now to FIG. 2, a schematic diagram of an illustrative multiplier circuit 110N in accordance with various embodiments is shown. In an embodiment, each multiplier circuit 110N may include a plurality of shifter, inverter, selector circuits 210N and a carry save adder 220. Each of the shifter, inverter, selector circuits 210N may be configured to receive at least a portion of the multiplicand (e.g., such as approximately 4 bits of the multiplicand), the multiplier, and the scaled multiplier. Based at least partially on the portion of the multiplicand, the multiplier, and/or the scaled multiplier, the shifter, inverter, selector circuits 210N may each output an intermediate output (illustrated as V) to the carry save adder 220. The intermediate output may be, for example, a result of a multiplication between the multiplier and the portion of the multiplicand. In some embodiments, the shifter, inverter, selector circuits 210N may each form the intermediate output by shifting and/or inverting the multiplier (or the scaled multiplier) based at least partially on the portion of the multiplicand received by the shifter, inverter, selector circuit 210N.

A number of shifter, inverter, selector circuits 210N included in a multiplier circuit 110N may be, for example, based at least partially on a size of the multiplicand (e.g., a number of bits of the multiplicand), an architecture of the multiplier circuit 110N (e.g., such as a Radix value of the architecture), or any other suitable criteria. A number of bits of the multiplicand received by each shifter, inverter, selector circuit 210N may be determined, for example, based on the architecture of the multiplier circuit 110N (e.g., such as a Radix value of the architecture). For example, for a Radix-8 architecture each shifter, inverter, selector circuit 210N may receive 4 bits of the multiplicand and for higher Radix architectures (e.g., such as Radix 16), the shifter, inverter, selector circuits 210N may each receive more than 4 bits of the multiplicand.

Each shifter, inverter, selector circuit 210N of the multiplier circuits 110N may provide its output to the carry save adder 220. The carry save adder 220 may receive the intermediate output of each shifter, inverter, selector circuit 210N and add the intermediate output to generate the carry-sum output of the carry save adder 220 for output by a respective multiplier circuit 110N for subsequent addition to form a partial product. The carry save adder 220 may determine the carry-sum output according to any suitable method and using any suitable hardware architecture, the scope of which are limited herein.

Figure 3:
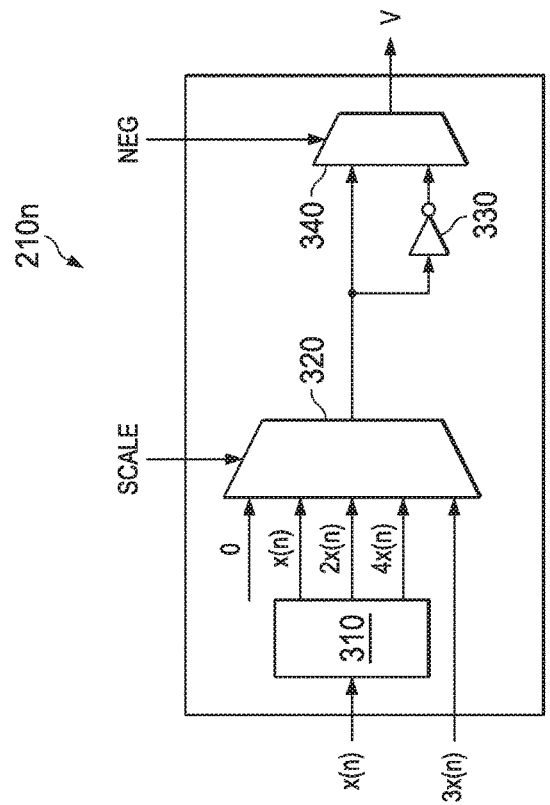
FIG. 3 shows a schematic diagram of an illustrative shifter, inverter, selector circuit in accordance with various embodiments.

Referring now to FIG. 3, a schematic diagram of an illustrative shifter, inverter, selector circuit 210N in accordance with various embodiments is shown. In an embodiment, the shifter, inverter, selector circuit 210N may include a shifter 310, a multiplexer 320, an inverter 330, and a multiplexer 340. The shifter 310 may receive the multiplier and generate scaled multipliers having values of 2× the multiplier and 4× the multiplier (illustrated respectively as 2x(n) and 4x(n)). In an embodiment, the shifter 310 is coupled to a plurality of inputs of the multiplexer 320. For example, the shifter 310 may include an output for each of the multiplier, the 2× scaled multiplier, and the 4× scaled multiplier and each output may couple to a separate input of the multiplexer 320. The multiplexer 320 may also receive at another input a value of zero, as well as the pre-scaled multiplier received by the multiplier circuits 110N and correspondingly the shifter, inverter, selector circuit 210N. An output of the multiplexer 320 may be coupled both to an input of the multiplexer 340 and an input of the inverter 330. An output of the inverter 330 may be coupled to another input of the multiplexer 340.

The shifter, inverter, selector circuit 210N may calculate an intermediate output that is a result of a multiplication of the multiplicand and the multiplier, for example, based at least partially on the portion of the multiplicand and the multiplier. For example, based on the portion of the multiplicand, the shifter, inverter, selector circuit 210N may choose between values of zero, the multiplier, the 2× scaled multiplier, the 4× scaled multiplier and the pre-scaled multiplier (e.g., having a value of 3× the multiplier). The shifter, inverter, selector circuit 210N may choose between the values using the multiplexer 320 based on a received scale control signal (illustrated as Scale) that may be based on the portion of the multiplicand. The shifter, inverter, selector circuit 210N may further calculate the intermediate output by inverting, or not inverting, the output of the multiplexer 320 through inverter 330 and multiplexer 340. For example, the shifter, inverter, selector circuit 210N may choose whether to output the output of the multiplexer 320 as the intermediate output or a negated version of the output of the multiplexer 320 based on a negation control signal (illustrated as Neg) received by the multiplexer 340. The negation control signal may also be based on the portion of the multiplicand. The negation of the output of the multiplexer 320 by the inverter 330 and the multiplexer 340 may be a one's complement inversion.

In some embodiments, the one's complement inversion may introduce an error into a final output of the shifter, inverter, selector circuit 210N, the multiplier circuit 110N containing the shifter, inverter, selector circuit 210N, and/or the multiplier-based programmable filter 100. An amount of the error (e.g., a value of the error) may be at least partially dependent on a number of ones complement negations performed in a given multiplier circuit 110N of the multiplier-based programmable filter 100. In some embodiments, the error may be pre-computed and compensated for in the multiplier-based programmable filter 100, for example, at an output of each multiplier circuit 110N for each respective multiplier circuit 110N or at an output of the multiplier-based programmable filter 100 for an accumulated error of all of the multiplier circuits 110N in the multiplier-based programmable filter 100.

Figure 4:
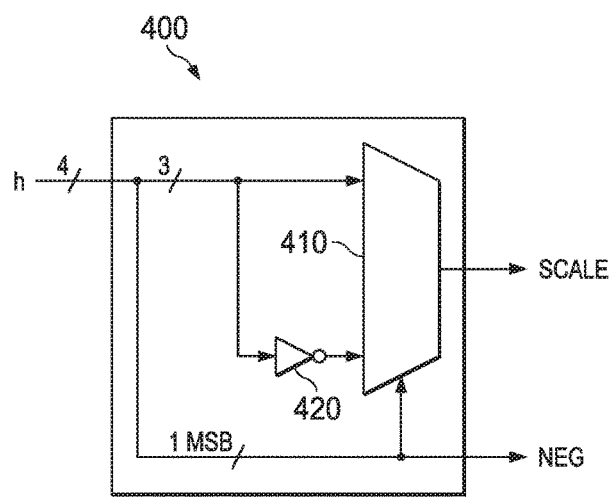
FIG. 4 shows a schematic diagram of an illustrative encoding circuit in accordance with various embodiments.

Referring now to FIG. 4, a schematic diagram of an illustrative encoding circuit 400 in accordance with various embodiments is shown. The encoding circuit 400 may be implemented, for example, in the shifter, inverter, selector circuit 210N to provide scale control signal and the negation control signal to the shifter, inverter, selector circuit 210N. In other embodiments, the encoding circuit 400 may be implemented outside of the shifter, inverter, selector circuit 210N but within a multiplier circuit 110N, or in any area of implementation within, or exterior to, the multiplier-based programmable filter 100. Regardless of the location of implementation, in an embodiment the encoding circuit 400 may be coupled to, and configured to control, a particular shifter, inverter, selector circuit 210N of a multiplier circuit 110N.

In an embodiment, the encoding circuit 400 comprises a multiplexer 410 and an inverter 420. The encoding circuit 400 may receive the portion of the multiplicand, as discussed above with respect to FIG. 3. For example, a first encoding circuit 400 associated with a first shifter, inverter, selector circuit 210N of a multiplier circuit 110N may receive a first series of four bits of the multiplicand and a second encoding circuit 400 associated with a second shifter, inverter, selector circuit 210N of the multiplier circuit 110N may receive a second series of four bits of the multiplicand. Based on the received bits of the multiplicand, the encoding circuit 400 may generate the scale control signal and the negation control signal for use by the shifter, inverter, selector circuit 210N with which the encoding circuit 400 is associated. For example, the encoding circuit 400 may designate a most significant bit (MSB) of the portion of the multiplicand received by the encoding circuit 400 as the negation control signal and may provide the remaining bits of the portion of the multiplicand to the multiplexer 410 at a first input and the inverter 420. The inverter 420 may invert the remaining bits of the portion of the multiplicand and provide the inverted bits to the multiplexer 410 at a second input. Based on a value of the negation control signal, the multiplexer 410 may output either the remaining bits of the portion of the multiplicand unchanged, or in the inverted form, as the scale control signal. The encoding circuit 400 may subsequently output the scale control signal and the negation control signal for use by the shifter, inverter, selector circuit 210N with which the encoding circuit 400 is associated.

Referring now to FIG. 5, a schematic diagram of an illustrative multiplier-based programmable filter 500 in accordance with various embodiments is shown. The multiplier-based programmable filter 500 may be substantially similar to the multiplier-based programmable filter 100 described above with respect to FIG. 1, may include like components, and may be implemented in substantially the same manner. The multiplier-based programmable filter 500 may further include a binary offset conversion circuit 510 and a bias compensation circuit 520. The binary offset conversion circuit 510 may be coupled between an input of the multiplier-based programmable filter 500 and an input of the pre-scaling circuitry 105. The bias compensation circuit 520 may be coupled to one of the adders 115N. Each of the binary offset conversion circuit 510 and the bias compensation circuit 520 may have an architecture of any suitable form and be constructed of any suitable components, neither of which are limited herein.

In operation, the binary offset conversion circuit 510 may be configured to convert the multiplier to a binary offset format prior to providing the multiplier to the pre-scaling circuitry 105. In an embodiment, the binary offset conversion circuit 510 may, for example, receive the multiplier in a two's complement format and convert the multiplier to the binary offset format. The binary offset conversion circuit 510 may convert the multiplier in the two's complement format to the multiplier in the binary offset format by inverting a most significant bit of the multiplier in the two's complement format.

Converting the multiplier in the two's complement format to the multiplier in binary offset format may, for example, enable arithmetic operations to be performed on the multiplier in an unsigned manner by the multiplier-based programmable filter 500. Converting the multiplier in the two's complement format to the multiplier in binary offset format may also, for example, introduce a bias into an output of the multiplier-based programmable filter 500. The bias may be equal to adding a value of $2^{M-1}$ to the input of the multiplier-based programmable filter 500, where M is a number of bits in the multiplier. The bias compensation circuit 520 may compensate for the bias introduced by the binary offset conversion circuit 510. A value of the compensation may be pre-computed, for example, based on the number of bits in the multiplier and/or on the filter coefficients and stored in a register. In some embodiments, the bias compensation circuit 520 may comprise a storage device configured to receive and store the value of the compensation before outputting the value of the compensation to one of the adders 115N. In some embodiments, the bias resulting from binary offset conversion may be pre-computed and compensated for in an output of the multiplier-based programmable filter 100 by any suitable means, a scope of which is not limited herein.

Figure 6:
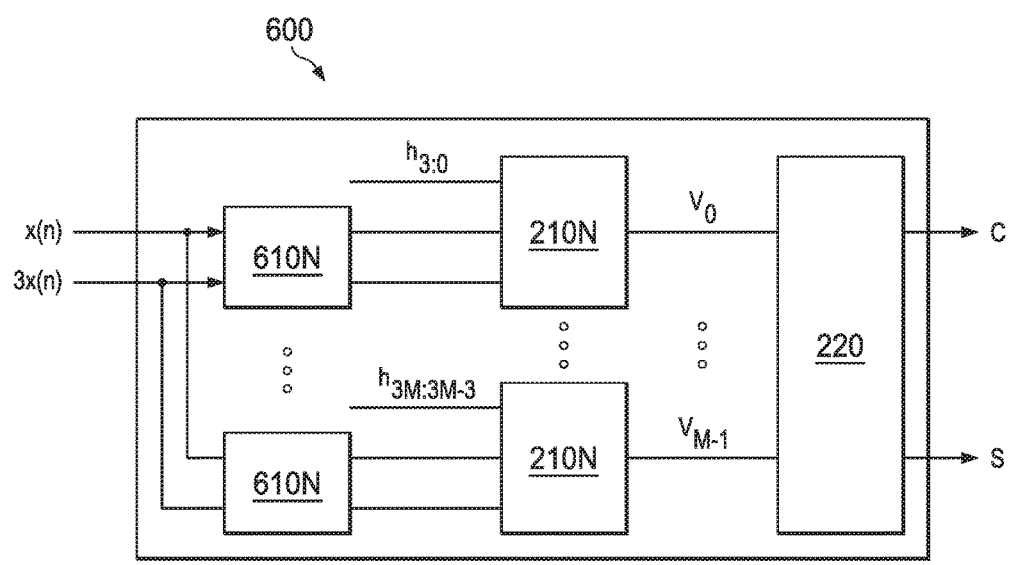
FIG. 6 shows a schematic diagram of an illustrative multiplier circuit in accordance with various embodiments.

Referring now to FIG. 6, a schematic diagram of an illustrative multiplier circuit 600 in accordance with various embodiments is shown. In an embodiment, the multiplier circuit 600 may be implemented interchangeably with the multiplier circuits 110N. The multiplier circuit 600 may include a plurality of shifter, inverter, selector circuits 210N and a carry save adder 220, each as discussed above with respect to FIG. 2. In an embodiment, the multiplier circuit 600 further comprises quantization circuitry 610N coupled between an input of the multiplier circuit 600 and input of each of the shifter, inverter, selector circuits 210N.

In operation, the quantization circuitry 610N may be configured to truncate the multiplier and the pre-scaled multiplier when they are received by the multiplier circuit 600. The quantization circuitry 610N may truncate the multiplier and the pre-scaled multiplier by discarding a portion of the least significant bits of the multiplier and the pre-scaled multiplier prior to processing by a shifter, inverter, selector circuit 210N. The quantization circuitry 610N may truncate the least significant bits of the multiplier and the pre-scaled multiplier according to any suitable means, the scope of which is not limited herein. In some embodiments, truncating the least significant bits of the multiplier and the pre-scaled multiplier may introduce a bias into an output of the multiplier circuit 600. The bias may be dependent, for example, on the multiplicand received by the multiplier circuit 600 and/or a number of least significant bits of the multiplier that are truncated. In some embodiments, the bias resulting from truncating the least significant bits of the multiplier and the pre-scaled multiplier may be pre-computed and compensated for in an output of the multiplier circuit 600 and/or the multiplier-based programmable filter 100 by any suitable means, a scope of which is not limited herein.

Figure 7:
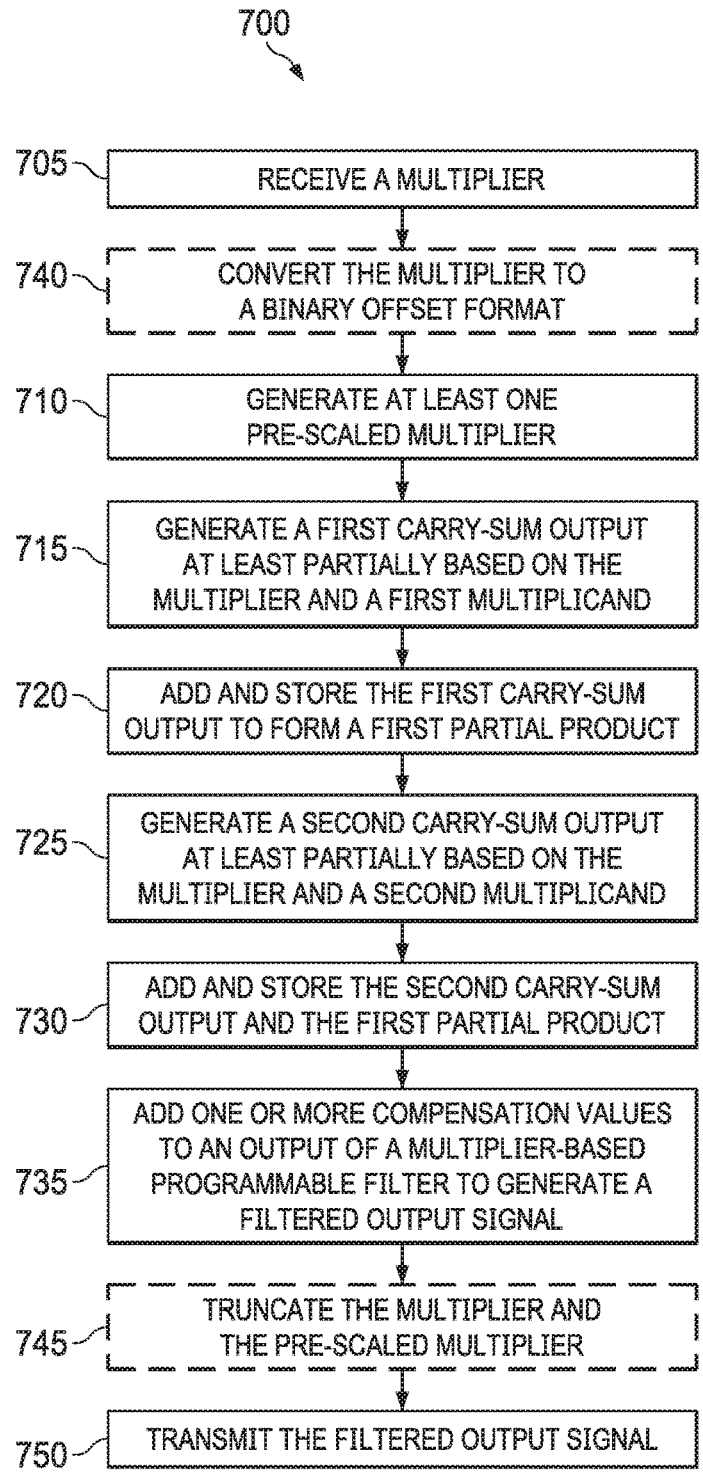
FIG. 7 shows a flowchart of an illustrative method of signal filtering in accordance with various embodiments.

Referring now to FIG. 7, a flowchart of a method 700 of signal filtering in accordance with various embodiments is shown. The method 700 may be implemented, for example, by a multiplier-based programmable filter such as the multiplier-based programmable filter 100, discussed with respect to any of the above figures. The method 700 may be implemented, for example, to filter a received multiplier based at least partially on a received multiplicand.

At operation 705, a multiplier is received. The multiplier is, for example, an input signal for filtering by the multiplier-based programmable filter. At operation 710, the multiplier is processed by pre-scaling circuitry to generate at least one pre-scaled multiplier. The pre-scaled multiplier may be, for example, three times the received multiplier. After generation of the at least one pre-scaled multiplier, the multiplier and any pre-scaled multipliers may each be transmitted to, and stored in, a storage device.

At operation 715, a first carry-sum output is generated based at least partially based on the multiplier and a first multiplicand. The first carry-sum output may be generated, for example, by a first multiplier circuit. The first multiplier circuit may include, for example, a plurality of shifter, inverter, selector circuits each operable to generate an intermediate output by scaling and/or negating the multiplier based at least partially on a portion of the first multiplicand. The first multiplier circuit may further include an adder operable to add the intermediate outputs to form the first carry-sum output. The shifter, inverter, selector circuits may each include encoding circuitry operable to determine a plurality of control signals for controlling at least a portion of a respective shifter, inverter, selector circuit to generate the intermediate result, the control signals based at least partially on the portion of the first multiplicand received by the respective shifter, inverter, selector circuit.

At operation 720, the first carry-sum output of the first multiplier circuit is added to form a first partial product and stored in a storage device. The first carry-sum output may be, for example, a carry output bus and a sum output bus that may be added together to form the first partial product.

At operation 725, a second carry-sum output is generated at least partially based on the multiplier and a second multiplicand. The second carry-sum output may be generated, for example, by a second multiplier circuit. The second multiplier circuit may include, for example, a plurality of shifter, inverter, selector circuits each operable to generate an intermediate output by scaling and/or negating the multiplier based at least partially on a portion of the second multiplicand. The second multiplier circuit may further include an adder operable to add the intermediate outputs to form the second carry-sum output. The shifter, inverter, selector circuits may each include encoding circuitry operable to determine a plurality of control signals for controlling at least a portion of a respective shifter, inverter, selector circuit to generate the intermediate result, the control signals based at least partially on the portion of the second multiplicand received by the respective shifter, inverter, selector circuit.

At operation 730, the second carry-sum output of the second multiplier circuit and the first partial product calculated and stored at operation 720 are added and stored in a storage device. The second carry-sum output may be, for example, a carry output bus and a sum output bus that may be added together to form a second partial product.

At operation 735, one or more compensation values are added to an output of the multiplier-based programmable filter to form a filtered output signal. The compensation values may be, for example, compensation for negations that may be performed during operation 715 and/or operation 725, binary offset conversion as discussed below in operation 740, and/or multiplier truncation as discussed below in operation 745.

Optionally, at operation 740 which may be at least partially performed after operation 705 and before operation 710, the multiplier may be converted to a binary offset format. The multiplier may be converted to the binary offset format, for example, by binary offset conversion circuitry. Converting the multiplier to the binary offset format may introduce a bias into the multiplier that may be compensated for in the compensations of operation 735.

Optionally, at operation 745 which may be performed by the first multiplier circuit before operation 715 and/or by the second multiplier circuit before operation 725, the multiplier and the pre-scaled multiplier may be truncated. Truncating the multiplier and the pre-scaled multiplier may remove or discard a portion of least significant bits of the multiplier and the pre-scaled multiplier.

At operation 750, the filtered output signal is transmitted by the multiplier-based programmable filter. The filtered output signal may be transmitted, for example, to another component of an electrical device such as a base station transceiver, may be transmitted to an end-user's device (e.g., a user equipment), or may be transmitted to a service provider device.

While the operations of the method 700 have been discussed and labeled with numerical reference, the method 700 may include additional operations that are not recited herein, any one or more of the operations recited herein may include one or more sub-operations, any one or more of the operations recited herein may be omitted, and/or any one or more of the operations recited herein may be performed in an order other than that presented herein (e.g., in a reverse order, substantially simultaneously, overlapping, etc.), all of which is intended to fall within the scope of the present disclosure.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. A device that is "configured to" perform a task or function may be configured (e.g., programmed) at a time of manufacturing by a manufacturer to perform the function or may be programmable by a user after manufacturing to perform the function. The configuring may be through firmware and/or software programming of the device, through a construction and/or layout of hardware components and interconnections of the device, or a combination thereof. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A multiplier-based programmable filter, comprising:
   a pre-scaling circuit;
   a first multiplier circuit coupled to a first output of the pre-scaling circuit and a second output of the pre-scaling circuit;
   a second multiplier circuit coupled to the first output of the pre-scaling circuit and the second output of the pre-scaling circuit;
   a first adder coupled to a first output of the first multiplier circuit and a second output of the first multiplier circuit;
   a second adder coupled to a first output of the second multiplier circuit and a second output of the second multiplier circuit;
   a first register coupled to an output of the first adder and an input of the second adder; and
   a second register coupled to an output of the second adder.

2. The multiplier-based programmable filter of claim 1, wherein the first multiplier circuit comprises:
   a first shifter, inverter, selector circuit;
   a second shifter, inverter, selector circuit; and
   a carry save adder coupled to an output of the first shifter, inverter, selector circuit and an output of the second shifter, inverter, selector circuit.

3. The multiplier-based programmable filter of claim 2, wherein the first multiplier circuit further comprises:
   first quantization circuitry coupled to an input of the first shifter, inverter, selector circuit; and
   second quantization circuitry coupled to an input of the second shifter, inverter, selector circuit.

4. The multiplier-based programmable filter of claim 2, wherein the first shifter, inverter, selector circuit comprises:
   a first multiplexer;
   a shifter coupled to an input of the first multiplexer;
   a second multiplexer coupled at a first input to an output of the first multiplexer; and
   an inverter coupled at an input to the output of the first multiplexer and at an output to a second input of the second multiplexer.

5. The multiplier-based programmable filter of claim 4, further comprising an encoding circuit that comprises:
   a third multiplexer having a first input coupled to a first node and a control input coupled to a second node and an output coupled to the control input of the first multiplexer; and
   an inverter having an input coupled to the first node and an output coupled to a second input of the third multiplexer.

6. The multiplier-based programmable filter of claim 5, wherein the control input of the second multiplexer is further coupled to the control input of the third multiplexer.

7. The multiplier-based programmable filter of claim 1, further comprising:
   a binary offset conversion circuit coupled to an input of the pre-scaling circuit; and
   a bias compensation circuit coupled to the first adder.

8. The multiplier-based programmable filter of claim 1, further comprising:
   a third register coupled between the first output of the pre-scaling circuit, the first multiplier circuit, and the second multiplier circuit; and
   a fourth register coupled between the second output of the pre-scaling circuit, the first multiplier circuit, and the second multiplier circuit.

9. A filter, comprising:
pre-scaling circuitry configured to:
receive a multiplier;
generate a pre-scaled multiplier based on the multiplier; and
output the multiplier and the pre-scaled multiplier;
a first multiplier circuit coupled to the pre-scaling circuitry and configured to:
receive the multiplier, the pre-scaled multiplier, and a first multiplicand;
calculate a first plurality of intermediate outputs based on the multiplier and the first multiplicand; and
calculate a first carry-sum output based on the first plurality of intermediate outputs, the first carry-sum output comprising a first carry output and a first sum output;
a first adder coupled to the first multiplier circuit and configured to add the first carry output and the first sum output to form a first partial product;
a second multiplier circuit coupled to the pre-scaling circuitry and configured to:
receive the multiplier, the pre-scaled multiplier, and a second multiplicand;
calculate a second plurality of intermediate outputs based on the multiplier and the second multiplicand; and
calculate a second carry-sum output based on the second plurality of intermediate outputs, the second carry-sum output comprising a second carry output and a second sum output; and
a second adder coupled to the second multiplier circuit and the first adder and configured to add the second carry output, the second sum output, and the first partial product.

10. The filter of claim 9, wherein the first multiplier circuit comprises:
a first shifter, inverter, selector circuit configured to:
receive the multiplier, the pre-scaled multiplier and a first portion of the first multiplicand;
generate a first of the first plurality of intermediate outputs based at least partially on the multiplier and the first portion of the first multiplicand;
a second shifter, inverter, selector circuit configured to:
receive the multiplier, the pre-scaled multiplier and a second portion of the first multiplicand;
generate a second of the first plurality of intermediate outputs based at least partially on the multiplier and the second portion of the first multiplicand; and
a carry save adder coupled to an output of the first shifter, inverter, selector circuit and an output of the second shifter, inverter, selector circuit and configured to add each of the first plurality of intermediate outputs to generate a carry-sum output.

11. The filter of claim 10, wherein the first shifter, inverter, selector circuit comprises:
a shifter configured to shift the multiplier to generate a plurality of scaled multipliers;
a first multiplexer coupled to the shifter and configured to select an output from among the multiplier, the scaled multipliers, the pre-scaled multiplier, or a value of zero based on a scale control signal;
an inverter coupled at an input to the output of the first multiplexer and configured to perform a one's complement inversion of the output of the first multiplexer; and
a second multiplexer coupled at a first input to an output of the first multiplexer, at a second input to an output of the inverter, and configured to select the first input or the second input for output by the second multiplexer as the first of the first plurality of intermediate outputs based on a negation control signal.

12. The filter of claim 11, further comprising an encoding circuit configured to receive the first portion of the first multiplicand and comprising:
a third multiplexer having a first input coupled to a first node and a control input coupled to a second node and an output coupled to the control input of the first multiplexer; and
an inverter having an input coupled to the first node and an output coupled to a second input of the third multiplexer, wherein a most significant bit of the first portion of the first multiplicand is the negation control signal; and wherein the third multiplexer is configured to select between the first input and the second input for output as the scale control signal based on the negation control signal.

13. The filter of claim 10, wherein the first multiplier circuit further comprises:
first quantization circuitry coupled to an input of the first shifter, inverter, selector circuit and configured to truncate the multiplier and the pre-scaled multiplier prior to receipt of the multiplier and the pre-scaled multiplier by the first shifter, inverter, selector circuit; and
second quantization circuitry coupled to an input of the second shifter, inverter, selector circuit and configured to truncate the multiplier and the pre-scaled multiplier prior to receipt of the multiplier and the pre-scaled multiplier by the second shifter, inverter, selector circuit.

14. The filter of claim 9, further comprising:
a binary offset conversion circuit coupled to an input of the pre-scaling circuit and configured to convert the multiplier to a binary offset format prior to receipt of the multiplier by the pre-scaling circuit, wherein converting the multiplier to the binary offset format introduces a bias into the filter; and
a bias compensation circuit coupled to the first adder and configured to provide a compensation for the bias.

15. The filter of claim 9, further comprising:
a first register coupled between the pre-scaling circuit, the first multiplier circuit, and the second multiplier circuit and configured to:
receive the multiplier from the pre-scaling circuit;
store the received multiplier; and
provide the stored multiplier to the first multiplier circuit, and the second multiplier circuit;
a second register coupled between the pre-scaling circuit, the first multiplier circuit, and the second multiplier circuit and configured to:
receive the pre-scaled multiplier from the pre-scaling circuit;
store the received pre-scaled multiplier; and
provide the stored pre-scaled multiplier to the first multiplier circuit, and the second multiplier circuit;
a third register coupled between the first adder and the second adder and configured to:
store the output of the first adder; and
provide the output of the first adder to the second adder; and
a fourth register coupled to the second adder and configured to store an output of the second adder.

16. A method implemented by a multiplier-based programmable filter, comprising:
receiving a multiplier;

generating, by pre-scaling circuitry, at least one pre-scaled multiplier;

generating, by a first multiplier, a first carry-sum output based at least partially on the multiplier and a first multiplicand;

adding, by a first adder, a carry output of the first carry-sum output and a sum output of the first carry-sum output to form a first partial product;

generating, by a second multiplier, a second carry-sum output based at least partially on the multiplier and a second multiplicand;

adding, by a second adder, a carry output of the second carry-sum output, a sum output of the second carry-sum output, and the first partial product;

adding one or more compensation values to an output of the second adder to generate a filtered output signal; and transmitting the filtered output signal by the multiplier-based programmable filter.

17. The method of claim 16, further comprising converting the multiplier to a binary offset format after receiving the multiplier and before generating the at least one pre-scaled multiplier.

18. The method of claim 16, further comprising truncating the multiplier and the pre-scaled multiplier after generating the pre-scaled multiplier and before generating the first carry-sum output and generating the second carry-sum output.

19. The method of claim 16, wherein generating the first carry-sum output comprises:
generating, via a plurality of shifter, inverter, selector circuits, a plurality of intermediate outputs; and
adding, via a carry-save adder, the plurality of intermediate outputs to generate the first carry-sum output.

20. The method of claim 19, wherein generating one of the plurality of intermediate outputs comprises:
shifting the multiplier to generate a plurality of scaled multipliers;
selecting a first output from among the multiplier, the scaled multipliers, the pre-scaled multiplier, or a value of zero based on a scale control signal;
inverting the first output; and
selecting from among the first output or the inverted first output for output as the one of the plurality of intermediate outputs based on a negation control signal.

* * * * *